United States Patent [19]

Yu et al.

[11] Patent Number: 5,735,452
[45] Date of Patent: Apr. 7, 1998

[54] BALL GRID ARRAY BY PARTITIONED LAMINATION PROCESS

[75] Inventors: Roy Yu, Wappingers Falls; William Harrington Brearley; Kimberley Ann Kelly, both of Poughkeepsie, all of N.Y.; Patrick Michael O'Leary, Redding, Conn.; Arthur Gilman Merryman, Hopewell Junction; James Patrick Wood, Beacon, both of N.Y.

[73] Assignee: International Business Machines Corporation, Armonk, N.Y.

[21] Appl. No.: 668,016

[22] Filed: Jun. 17, 1996

[51] Int. Cl.⁶ .................................................. B23K 31/02
[52] U.S. Cl. ...................... 228/254; 228/180.22; 228/14
[58] Field of Search ...................... 228/180.22, 254, 228/14

[56] References Cited

U.S. PATENT DOCUMENTS

| | | | |
|---|---|---|---|
| 4,412,642 | 11/1983 | Fisher, Jr. | 228/173 R |
| 5,024,372 | 6/1991 | Altman et al. | 228/254 |
| 5,241,134 | 8/1993 | Yoo | 174/94 R |
| 5,573,170 | 11/1996 | Sasaki et al. | 228/14 |

FOREIGN PATENT DOCUMENTS

| | | | |
|---|---|---|---|
| 4-167590 | 6/1992 | Japan . | |
| 5-67618 | 3/1993 | Japan | 228/180.22 |
| 6-69640 | 3/1994 | Japan . | |

*Primary Examiner*—P. Austin Bradley
*Assistant Examiner*—Jeffrey T. Knapp
*Attorney, Agent, or Firm*—H. Daniel Schnurmann

[57] ABSTRACT

A method for forming a ball grid array to provide a chip carrier with I/O capabilities is described. The method includes combining three distinct steps into one: partitioning a solder sheet into identical solder pieces using a mask provided with openings that match the footprint of the chip carrier; reflowing the solder pieces into solder balls; and joining the balls to the I/O pads of the chip carrier. By combining these three steps into one, a high throughput, high volume, defect free and contamination free operation for forming I/O connections thus results.

12 Claims, 2 Drawing Sheets

- Injection Molding

- Partitioned Lamination

BALL GRID ARRAY BY PARTITIONED LAMINATION PROCESS

FIELD OF THE INVENTION

This invention generally relates to a method of forming a ball grid array I/O structure used for chip carriers, and more particularly, to a method of forming solder balls from a solid sheet of solder.

BACKGROUND OF THE INVENTION

Present day chip carriers, such as single-chip modules, multi-chip modules, and the like, routinely use solder balls to provide I/O connections when mounted on the next level of packaging, such as cards and the like. These solder balls have, in many instances, effectively replaced module pins, by providing a low cost and a more reliable solution for attaching chip carriers to a card. More importantly, solder balls arranged in a tightly knit array, known as a Ball Grid Array (BGA), provides I/O connections with considerably higher density than the one previously provided by module pins.

A Ball Grid Array (BGA) process normally requires three distinct and separate steps: 1) positioning solder balls with great accuracy, 2) solder reflowing, to shape the solder balls into a perfect sphere, and 3) joining the balls to the carrier I/O pads. Solder balls normally have an inner hard solder core, typically, in a ratio of 90% Pb and 10% Sn, surrounded by an outer layer having a ratio of 60% Pb and 40% Sn. The core is used to provide a predetermined spacing between the chip carrier and the chip, while the outer coat joins the chip to the carrier.

Several techniques have been successfully employed over the years to attach solder balls, the most common being the Standard Solder Ball Connect (SBC) process which uses precision balls that are shaken into place through holes in a mask. This method, although quite accurate, is labor intensive, time consuming and, consequently, expensive, since the setup must be laboriously looked over to ensure that each hole is fully populated. Furthermore, oftentimes rework on the SBC can leave behind a ball on the card or substrate, which may be the cause of future reliability problems.

Additional techniques have been proposed with varying degrees of success, as for instance, casting to form solder columns. These columns may conceivably be extended to include short columns, which structurally are comparable to SBCs. By way of example, a casting technique is disclosed in U.S. Pat. No. 4,412,642 issued to Fisher Jr., that describes the attachment of leadless chip carriers to a printed circuit board. The soldering technique provides an elongated body of solder serving as cast material, and positions it in alignment with a mold cavity of a molding plate, heats the plate and applies a force on the body while it is heated, forcing the molten material into the mold cavity.

A second, widely used technique has pieces of solder mechanically removed from a sheet. This approach is described in U.S. Pat. No. 5,241,134 issued to Yoo, wherein the solder pieces are dropped into a mold hold. A multi-lead component is then positioned over the mold holder allowing the terminals to make contact with the solder pieces. The solder is then reflowed and cooled to form a solder body on the terminals. Clearly, such a technique can advantageously be used for low density surface mounted technology, such as wire bonding, lead frame joining, and the like. However, in a high-density I/O BGA environment, wherein solder balls are positioned in close proximity of each other, bridging between the I/Os will occur during the solder reflow process. This problem is further compounded by the lateral movement of the solder balls that occurs during this process, and which potentially may cause one or more solder balls to be joined together.

In yet another instance, disclosed in Japanese Patent 06-069640 to Yoshino Kiichi, is a method of forming a solder ball with high precision, wherein a solder is initially punched from a solder sheet and transferred to an adhesive, and from the adhesive to the I/O pads of an IC. A similar approach is described in Japanese Patent 04-167590 to Kusoya Kimio wherein a solder sheet is punched to a predetermined size and pattern for a pre-tinning operation of the I/O leads of a circuit board. Both approaches, i.e., Kiichi and Kimio, suffer from similar limitations as those recited for the Yoo Patent, namely, the lateral movement of solder during the solder reflow operation which may lead to I/O bridging in a high density environment.

FIGS. 1a–1b grapically illustrates a typical prior art apparatus used to form a BGA. A graphite boat 10 is shown with a series of hemispherical depressions upon which precision balls 20, preferably having an inner core of 90% Pb, 10% Sn and an outer core of 60% Pb and 40% Sn. These balls are dropped into depressions molded into the boat, one ball per depression. The alignment of each ball/depression is tightly monitored to correspond to a predetermined pitch required by balls of a given diameter. Excess balls are swept away by a brush. The boat is brought in close contact with the backside of the chip carrier 30 which typically carries a plurality of chips 35. Each ball 20 is then joined to its corresponding pad 45 by a solder reflow process that returns the balls to their spherical shape.

FIGS. 2a–2b illustrates a second prior art apparatus used in the formation of a BGA. A KEPTON™ mask 80 having apertures 70 lined up on at least two side by side columns is positioned above the pads 40 of the carrier. Solder material in molten state is injected through the apertures 70 into holes 60 directly on top of the pads. In order to urge the solder material through the narrow apertures and into the holes 60, both, pressure on the material coupled to a vacuum in a path leading from a pad in one column to a corresponding pad in the second column ensures that the holes are filled with solder material. The mask 70 is then removed, and once again the solder material on each pad is subjected to the solder reflow process which ensures that each ball acquires a perfectly spherical shape (FIG. 2b).

The aforementioned prior art methods suffer from one or more disadvantages, either in the cost, or in a difficult and time consuming rework process, and/or in the reliability aspect. Those methods include other types of difficulties, some of which arise from a lack of control on the amount of solder at each connection, while others suffer from constraints created by the requirement of mechanical means as part of the process. Regardless as to which process is used, the common denominator is that each solder ball within the array requires individual positioned, with negative implications on the cost associated with the process.

SUMMARY OF THE INVENTION

The foregoing problems are overcome and other advantages are provided by a method of forming a ball-grid array to provide a chip carrier with I/O capabilities, the ball-grid-array being attached to pads positioned on the chip carrier, the method comprising the steps of: placing a mask, having a pattern of individual openings matching the footprint of the pads, in contact with the pads; placing a sheet of solder material in contact with the mask; pressing the sheet of solder material against the mask causing the breaking of the sheet into pieces; trapping each of the pieces inside each of the individual openings; and heating at least the trapped pieces to melt the pieces, the trapped pieces taking a shape that is determined by the shape of the mask openings; and joining the shaped trapped pieces to their corresponding pad.

OBJECTS OF THE INVENTION

Accordingly, it is a primary object of the present invention to form a BGA using a solder sheet instead of forming individual solder balls when making the I/O terminals of a chip carrier.

It is another object of the present invention to form a BGA through a partitioned laminated process.

It is a further object of the present invention to form a BGA by merging three process operations into one, and more particularly, partitioning a solder sheet into individual solder pieces, solder reflowing the individual sheets into solder balls, and joining the solder balls thus formed to the I/O pads of a chip carrier.

It is yet another object of the present invention to form a BGA in a high volume, high throughput process, while maintaining a high reliability and a defect and contamination free operation.

It is still another object of the present invention to control the thickness of the solder balls by a mask having a mesh of varying thickness, wherein the mesh also ensures self alignment and spacing of the balls forming the BGA.

It is a more particular object of the present invention to further insure solder I/O uniformity by eliminating eutectic coating.

It is still a further object of the present invention to simplify the process of making a BGA by stacking, reflowing and self aligning in one process step.

It is yet a further object of the present invention to provide a method of forming a BGA without incurring the risk of bridging, which is particularly applicable when solder balls of substantial diameter need to be positioned in such close proximity.

BRIEF DESCRIPTION OF THE DRAWINGS

The foregoing and other objects, aspects and advantages of the present invention will become more apparent and better understood by reference to the following description of a preferred embodiment of the invention taken in conjunction with the accompanying drawings, wherein.

DETAILED DESCRIPTION OF THE INVENTION

Figure 1A:
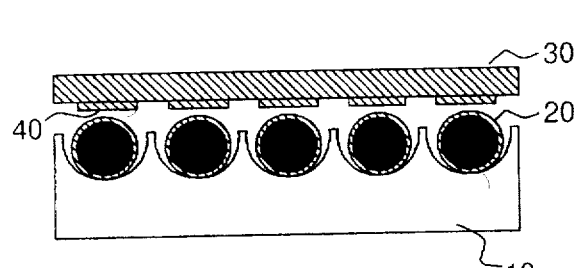
FIGS. 1a–1b are sectional views of a prior art apparatus used in the process of forming a BGA.
Figure 1B:
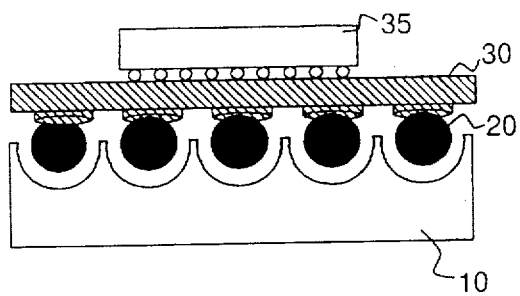
Figure 2A:
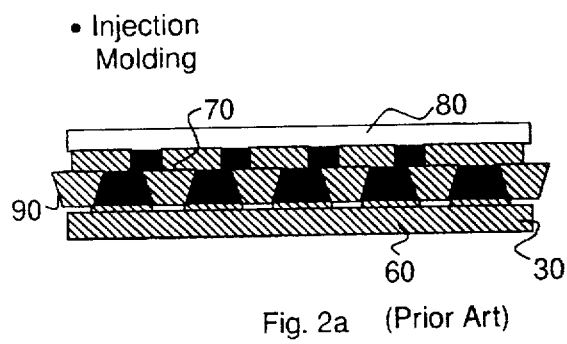
FIGS. 2a–2b are sectional views of another prior art apparatus used in the process of forming a BGA.
Figure 2B:
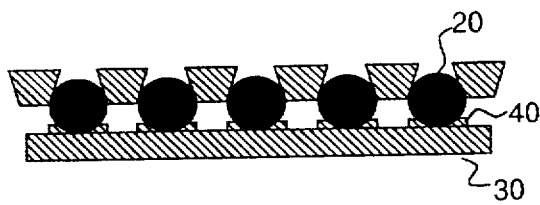
Figure 3A:
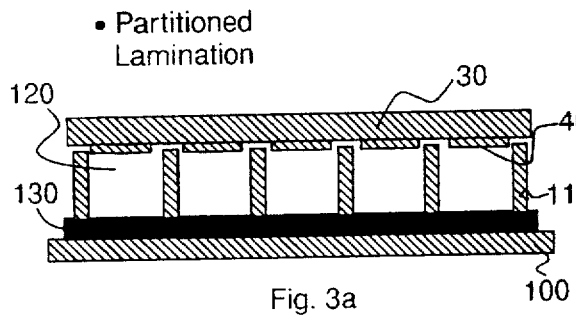
FIGS. 3a–3b show sectional views of an apparatus that can advantageously be used to implement the partitioned lamination process, in accordance with the present invention.
Figure 3B:
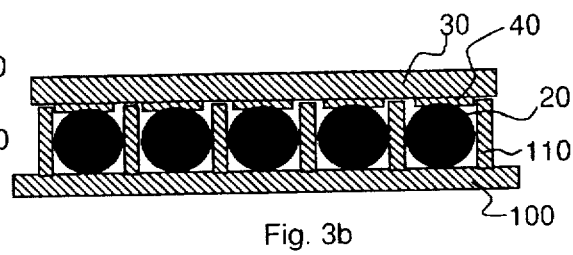

With reference to the drawings, wherein the same reference numbers indicate the same elements throughout, there is shown in FIGS. 3a–3b, an arrangement that is illustrative of the various structural and operational elements of an apparatus designed to allow a partitioned lamination process.

The arrangement of the present invention comprises a solder sheet 130 of uniform thickness encrusted in a mesh forming mask 110, wherein the grid that delineates each square opening within the mesh are designated by numeral 110. The perimeter of each square is designed to snugly fit around each I/O pad 40 of the chip carrier 30. Excess solder material within the mesh is shown by numeral 120. The mask is then brought to a close proximity of the pads. In as much as the solder material lacks much depth and is therefore easy to cut under pressure, a compliant material 100, preferably of a rubber nature, is placed on the back side of the mask to break the solder sheet into equal size squares. The conversion of the solder sheet into individual pieces is facilitated by the sharp edges of the wires that form the perimeter of each square. Moreover, the sheet of solder material on the mask is deposed taking particular care that its thickness remains uniform. Thus, each piece of broken solder has essentially the same depth. With the mask kept in this position, the assembly comprising the mask, the pieces of solder and the chip carrier is placed in a furnace, at a temperature suitable to achieve solder reflow. The pieces of solder melt and adopt a spherical shape (or a shape that is determined by the shape of the mask openings), each ball having essentially the same diameter, since each ball is constrained by the walls of each opening within the wire grid. Surface tension inhibits the molten solder material from flowing freely and allows the totality of the material within the opening to be absorbed within the ball. Furthermore, the balls in their molten state adhere to the pads, securing a good joint. The assembly is then removed from the oven, allowing the balls to cool. The mask is dislodged, leaving behind a BGA fully formed on the back side of the chip carrier 30.

Practitioners of the art will fully appreciate that this process has the distinct advantage of forming a complete BGA in a single operation, the so-called partitioned laminated process that includes: 1) positioning the solder material with precision on top of each pad, 2) solder reflowing, and 3) joining the balls to the pads. Since there are no limitations to the size of the mask, it is evident that a plurality of BGA can be formed in a single operation, thereby providing a high throughput and a high volume to an otherwise cumbersome and time consuming process.

In a modified version of the preferred embodiment, shown in FIGS. 4a–4f, there is shown a stretched BGA, with the balls taking an elongated shape.

Figure 4A:
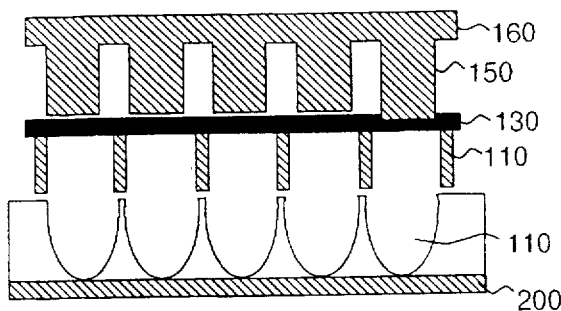
FIGS. 4a–4f show sectional views of a modified version of the partitioned lamination process used to obtain a stretched BGA, in accordance with the present invention.
Figure 4B:
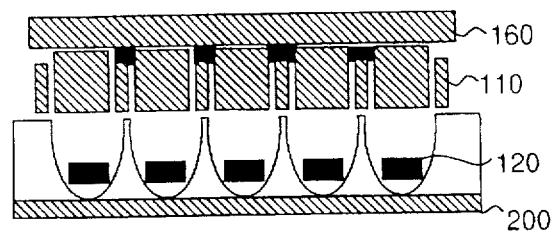
Figure 4C:
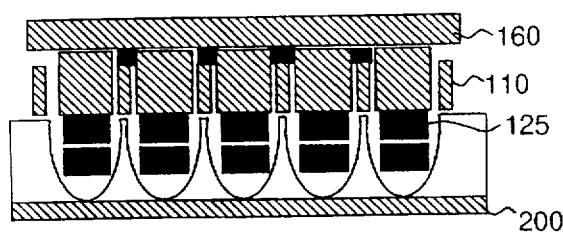
Figure 4D:
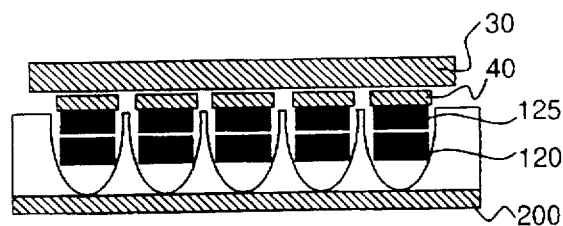
Figure 4E:
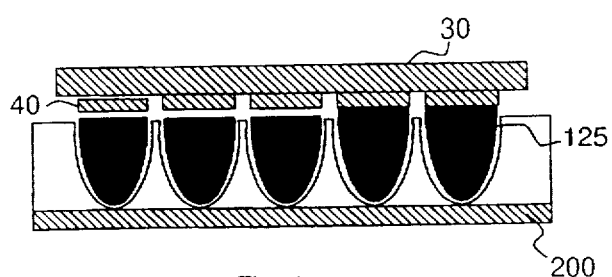
Figure 4F:
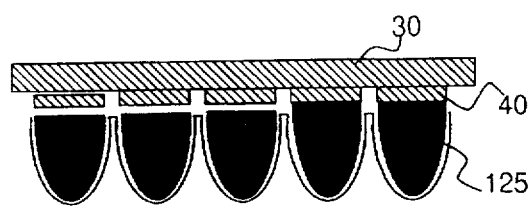

Referring now to FIG. 4a, there is shown a receptacle or boat 200 with depressions having an oblong shape (e.g., the shape of a tear drop) and a footprint that precisely matches that of the I/O pads of the chip carrier. In a preliminary operation, a sheet of solder material 130 is placed on top of a mask 110 provided with a wire mesh. The boat 200 is placed directly underneath the mask, with each opening in the mask matching a depression within the boat. A piston 160 with "teeth" 150 that precisely matches the position of each depression 140 exerts pressure on the solder sheet 130, breaking it into square pieces. The broken pieces fall at the bottom of each opening or depression within the mesh (FIG. 4b). A second sheet is then placed at the same position as the first sheet, and the process is repeated. Alternatively, a sheet with a thicker mesh may be used, but it may require providing a piston with longer "teeth" to accommodate the thicker wires making the mask. Ultimately, each depression within the receptacle fills with pieces of solder, as shown in FIG. 4c. The mask is then removed and the boat is brought in close proximity to the carrier, making sure that each depression matches the position of each pad. The assembly is then placed in an furnace at solder reflow temperature, which melts the individual pieces, making them adopt the shape of the mold which holds them. With the boat exerting pressure against the back side of the carrier, the balls are joined to the pads (FIG. 4d). The assembly is removed from the furnace and is allowed to cool. The balls slightly shrink and separate from the mold. The boat is removed, leaving behind a perfectly formed stretched out BGA (FIG. 4f).

Whereas the shape of the depressions in the boat was described as oblong, alternate shapes, such as prismatic, cubic and the like, could advantageously be used, giving the balls a square like appearance.

While the invention has been shown and described with reference to a preferred embodiment thereof, it will be understood by those skilled in the art that various changes in form and details may be made therein without departing from the scope and spirit of the invention.

We claim:

1. A method of forming a ball-grid array to provide a chip carrier with I/O capabilities, said ball-grid-array being attached to pads positioned on said chip carrier, said method comprising the steps of:
   a) placing a mask, having a pattern of individual openings matching the footprint of said pads, in contact with said pads;
   b) placing a sheet of solder material in contact with said mask;
   c) pressing said sheet of solder material against said mask causing the breaking of said sheet into pieces, and trapping each of said pieces inside each of said individual openings;
   d) heating at least said trapped pieces to melt said trapped pieces, said trapped pieces taking a shape that is determined by the shape of said openings; and
   e) joining said shaped trapped pieces to their corresponding pad.

2. The method of forming a ball-grid-array as recited in step a) of claim 1, wherein said mask further comprises a mesh of wires that provides said openings matching the footprint of said pads.

3. The method of forming a ball-grid-array as recited in step a) of claim 1, wherein said sheet of metal has a uniform thickness.

4. The method of forming a ball-grid-array as recited in step b) of claim 1, further comprising melting said solder material onto said mask.

5. The method of forming a ball-grid-array as recited in step c) of claim 1, wherein a rubbery material is used for pressing said sheet of solder material against said mask.

6. The method of forming a ball-grid-array as recited in step c) of claim 1, wherein each of said trapped pieces occupies one opening within said mesh.

7. The method of forming a ball-grid-array as recited in step c) of claim 1, wherein each of said trapped pieces converts into a spherical ball having a diameter that matches the width of one of said openings.

8. The method of forming a ball-grid-array as recited in step d) of claim 1, further comprising heating said trapped pieces jointly with said mask and said chip carrier.

9. A method of forming a ball-grid array having stretched-out balls to provide a chip carrier with I/O capabilities, said ball-grid-array being attached to pads positioned on said chip carrier, said method comprising the steps of:
   a) providing a mask having a pattern of individual openings matching the footprint of said pads;
   b) placing in close contact a sheet of solder material on top of said mask;
   c) placing a receptacle having openings that match the footprint of said pads under said mask;
   d) pressing said sheet of solder material against said mask causing the breaking of said sheet into pieces, and trapping each of said pieces inside each of said individual openings of said receptacle;
   e) repeating steps b) and c) until said openings of said receptacle are filled with said broken pieces;
   f) placing said receptacle filled with broken pieces in close contact with said pads; and
   g) heating at least said trapped pieces to melt said trapped pieces, said trapped pieces taking the shape of said openings of said receptacle and being joined to their corresponding pad.

10. The method of forming a ball-grid array having stretched-out balls as recited in claim 9, wherein said opening in said receptacle take an oblong shape.

11. The method of forming a ball-grid-array as recited in step a) of claim 9, wherein said mask further comprises a mesh of wires that provides said openings matching the footprint of said pads.

12. The method of forming a ball-grid-array as recited in step d) of claim 9, wherein a rubbery material is used for pressing said sheet of solder material against said mask.

* * * * *